(12) United States Patent
Sato

(10) Patent No.: US 9,971,056 B2
(45) Date of Patent: May 15, 2018

(54) PROXIMITY SENSOR

(71) Applicants: KYUSHU INSTITUTE OF TECHNOLOGY, Kitakyushu-shi, Fukuoka (JP); AI TECHNOLOGY INC., Fukuoka-shi, Fukuoka (JP)

(72) Inventor: Yasushi Sato, Kitakyushu (JP)

(73) Assignees: KYUSHU INSTITUTE OF TECHNOLOGY, Kitakyusha-shi (JP); AI TECHNOLOGY INC., Fukuoka-shi (JP)

( * ) Notice: Subject to any disclaimer, the term of this patent is extended or adjusted under 35 U.S.C. 154(b) by 118 days.

(21) Appl. No.: 15/023,051

(22) PCT Filed: Sep. 10, 2014

(86) PCT No.: PCT/JP2014/073990
§ 371 (c)(1),
(2) Date: Mar. 18, 2016

(87) PCT Pub. No.: WO2015/041121
PCT Pub. Date: Mar. 26, 2015

(65) Prior Publication Data
US 2016/0238732 A1   Aug. 18, 2016

(30) Foreign Application Priority Data
Sep. 19, 2013  (JP) ................... 2013-194081

(51) Int. Cl.
| G06F 3/041 | (2006.01) |
| G06F 3/045 | (2006.01) |
| G01V 3/10  | (2006.01) |
| H03K 17/95 | (2006.01) |

(52) U.S. Cl.
CPC .............. *G01V 3/105* (2013.01); *G01V 3/101* (2013.01); *H03K 17/9545* (2013.01)

(58) Field of Classification Search
CPC ..... G01V 3/105; G01V 3/101; H03K 17/9545
USPC .................................................. 345/173, 174
See application file for complete search history.

(56) References Cited

U.S. PATENT DOCUMENTS

| 6,603,306 B1 * | 8/2003 | Olsson ................. H03K 17/945 |
| | | 324/207.17 |
| 2015/0054774 A1 * | 2/2015 | Fergusson ................ G01B 7/14 |
| | | 345/174 |

FOREIGN PATENT DOCUMENTS

| JP | H11-17515 A   | 1/1999 |
| JP | 2003-315295 A | 11/2003 |
| JP | 2004-257848 A | 9/2004 |
| JP | 2005-134236 A | 5/2005 |

OTHER PUBLICATIONS

Nov. 11, 2014 Search Report issued in International Patent Application No. PCT/JP2014/073990.

* cited by examiner

*Primary Examiner* — Farhana Hoque
(74) *Attorney, Agent, or Firm* — Oliff PLC

(57) ABSTRACT

A first oscillation circuit in which a helical antenna is used as a part of an element for a resonance circuit and a second oscillation circuit in which a loop antenna is used as a part of an element for a resonance circuit are caused to oscillate at substantially the same frequency. When a human body approaches the helical antenna and the loop antenna, the frequency difference between the first oscillation circuit and the second oscillation circuit increases. This frequency difference is extracted using a BPF.

6 Claims, 5 Drawing Sheets

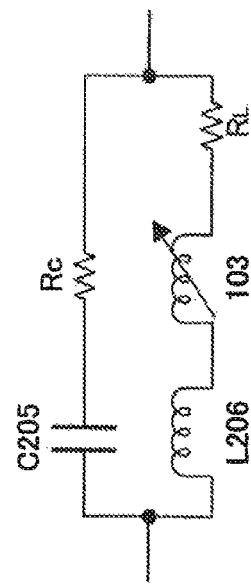
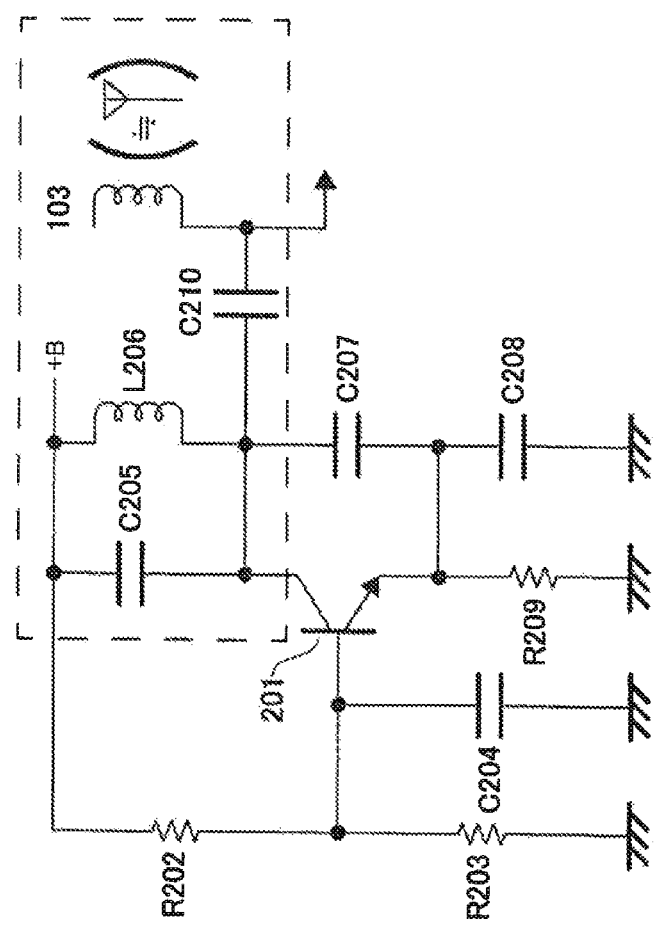
FIG. 2A
FIG. 2B

PROXIMITY SENSOR

TECHNICAL FIELD

The present invention relates to a proximity sensor using an electric wave.

BACKGROUND ART

As to proximity sensors detecting that a human body has approached an arbitrary target object, there exist various ones depending on the detection method thereof.

In human detection sensors that use light such as infrared rays, a prescribed "window" is necessary for a light receiving element to receive thermal infrared rays emitted from a human body, or to irradiate a human body with infrared rays from an infrared light emitting diode and receive the reflected light.

On the other hand, a human detection sensor that detects the change in electrostatic capacitance, which is recently used widely for smart phones etc., has an extremely short detection distance.

CITATION LIST

Patent Literature

PTL 1: Japanese Patent Laid-Open No. 2004-257848
PTL 2: Japanese Patent Laid-Open No. 2005-134236

SUMMARY OF INVENTION

Technical Problem

As a sensor that does not require preparation of a window, unlike sensors that use light such as infrared rays, and can set a longer detection distance as compared with sensors that detect the change in electrostatic capacitance, there is a sensor that uses an electric wave. (see, for example, Patent Literature 1)

The sensor disclosed in Patent Literature 1 is a kind of sensors using an electric wave, and is one called a Doppler sensor. The Doppler sensor is a sensor that detects the presence of a target object etc. while utilizing the Doppler effect, as named after the name thereof.

However, Doppler sensors use, for example, ultrahigh frequencies such as 10 GHz. Semiconductor elements for dealing with an electric wave of such a high frequency are expensive, and the circuit design and mass-production thereof are also very difficult. As a result, applicable objects of Doppler sensors are limited.

The sensor disclosed in Patent Literature 2 supplies a frequency having a wavelength sufficiently short as compared with the dimension of a conductive member to the conductive member from an output oscillator, and emits a microwave using the conductive member as an antenna. When the sensor emits a microwave using a conductive member as an antenna, if a detection target (dielectric substance) approaches a region to which the microwave is emitted, the conductive member and the detection target form a deemed circuit that is deemed as a cavity resonance circuit in which one of the conductive member and the detection target functions as an antenna for the other and vice versa, and the electric field of the electromagnetic wave emitted from the conductive member is reflected or absorbed by the detection target. In the deemed circuit, the electric field of the electromagnetic wave emitted from the conductive member is reflected or absorbed by the detection target, and the influence appears as the change in the output frequency of the output oscillator. Accordingly, it is possible to detect the detection target by detecting the shift of an oscillating frequency of the output oscillator and the amplitude of a specific frequency. However, the sensor disclosed in Patent Literature 2 uses an electric wave of a microwave having a frequency from 300 MHz to 300 GHz, and the circuit thereof becomes expensive and difficult to be mass-produced.

The present invention has been achieved in consideration of such circumstances, and an object thereof is to provide a proximity sensor that is inexpensive and, in addition, can freely set a detection distance of a detection target, using an electric wave having a comparatively low frequency.

Solution to Problem

In order to solve the problem, the proximity sensor according to one aspect of the present invention includes a first oscillation circuit that uses a first antenna having an open end as a part of an element for a resonance circuit, and a second oscillation circuit that uses a second antenna having both ends connected to a circuit as a part of an element for a resonance circuit. Further, there is provided a proximity detection unit that detects a proximity state of an arbitrary detection target based on the frequency difference between a first output signal output from the first oscillation circuit and a second output signal output from the second oscillation circuit.

Advantageous Effects of Invention

According to one aspect of the present invention, a proximity sensor, which is inexpensive and, in addition, can freely set a detection distance of a detection target using an electric wave of a comparatively low frequency, can be provided.

Problems, configurations and effects other than those described above will become clear by explanations of the embodiment below.

BRIEF DESCRIPTION OF DRAWINGS

FIGS. 2A and 2B show a circuit diagram of a first oscillation circuit and an equivalent circuit of a part thereof, respectively.

DESCRIPTION OF EMBODIMENTS

[Overall Configuration of Proximity Sensor 101]

Figure 1:
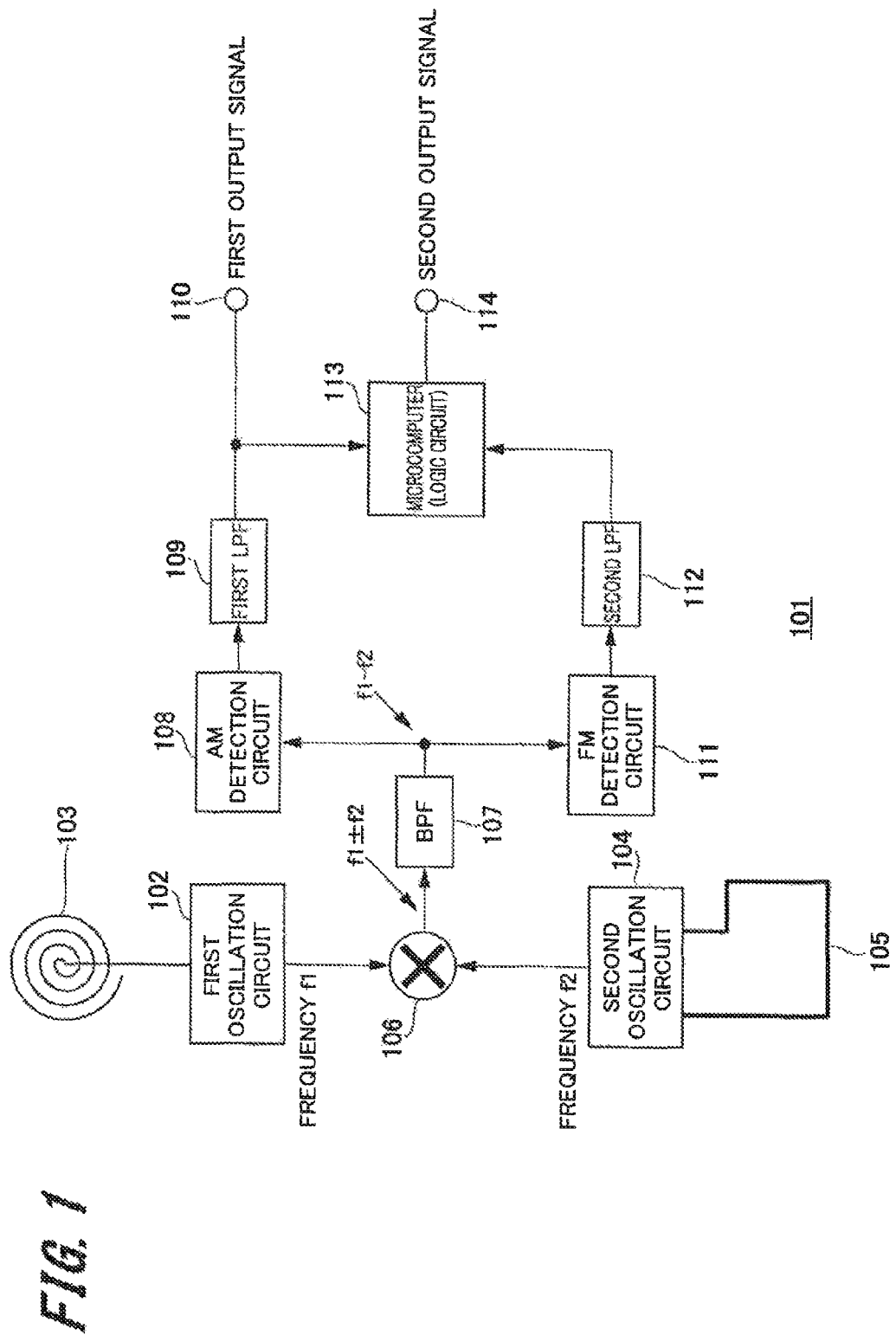
FIG. 1 is a block diagram of a proximity sensor according to an embodiment of the present invention.

FIG. 1 is a block diagram of the proximity sensor 101 according to an embodiment of the present invention.

The proximity sensor 101 according to an embodiment of the present invention can be divided into a first oscillation circuit 102 having a helical antenna 103, a second oscillation circuit having a loop antenna 105, and a signal processing circuit subsequent to a mixer 106.

The mixer 106, a BPF 107 and an AM detection circuit 108 can be considered as a proximity detection unit detecting a proximity state of an arbitrary detection target based on a signal of a first frequency f1 output from the first oscillation circuit 102 and a signal of a second frequency f2 output from a second oscillation circuit 104.

The first oscillation circuit 102 oscillates a signal of the first frequency f1, and emits an electric wave of the first frequency f1 from the helical antenna 103. Meanwhile, the first oscillation circuit 102 is also a resonance circuit in which an oscillating frequency changes following the change in the distribution constant of the helical antenna 103.

The second oscillation circuit 104 oscillates a signal of the second frequency f2, and emits an electric wave of the second frequency f2 from the loop antenna 105. Meanwhile, the second oscillation circuit 104 is also a resonance circuit in which an oscillating frequency changes following the change in the distribution constant of the loop antenna 105.

Each of the signal of the first frequency f1 output from the first oscillation circuit 102 and the signal of the second frequency f2 output from the second oscillation circuit 104 is input to the mixer 106. The mixer 106 is an analog multiplier and outputs signals of f1±f2.

The output signals of the mixer 106 are input to a band pass filter (hereinafter abbreviated as "BPF") 107. The BPF 107 takes out a signal of |f1−f2| from the signals of f1±f2.

A signal of a specific frequency range that is output from the BPF 107 is subjected to envelope detection, for example, by the well known AM detection circuit 108 composed of a diode. Then, a noise component is removed through a first LPF 109 being a low-pass filter (hereinafter abbreviated as "LPF"), and a first output signal is output from a first output terminal 110.

The above is the fundamental configuration of the proximity sensor 101 according to an embodiment of the present invention. Meanwhile, the configuration and operation explanation of an FM detection circuit 111, a second LPF 112, a microcomputer 113 and a second output terminal 114 will be described later.

[Specific Example of First Oscillation Circuit 102]

FIG. 2A is a circuit diagram of the first oscillation circuit 102. FIG. 2B is an equivalent circuit of the part surrounded by a dotted line in the circuit diagram of the first oscillation circuit 102.

The first oscillation circuit 102 is a well known base grounded type Colpitts oscillation circuit.

The base of a transistor 201 being an NPN transistor is supplied with a fixed bias current by resistances R202 and R203, and is grounded in an alternating-current manner by a capacitor C204.

A capacitor C205 and a coil L206 are connected in parallel between the collector of the transistor 201 and a power supply terminal +B.

A capacitor C207 is connected between the collector and emitter of the transistor 201.

A capacitor C208 and a resister R209 are connected in parallel between the emitter of the transistor 201 and a ground node.

The helical antenna 103 is connected to the collector of the transistor 201 via a capacitor C210.

An output signal of the first oscillation circuit 102 is obtained from the collector of the transistor 201 through the capacitor C210.

The capacitors C205 and C210, the coil L206 and the helical antenna 103 which are surrounded by the dotted line part in FIG. 2A can be deemed as an alternating current equivalent circuit shown in FIG. 2B.

In FIG. 2B, a resistance component $R_c$ is included in the capacitor C205. Further, a resistance component $R_L$ is included in the coil L206 and the helical antenna 103.

The helical antenna 103 is connected in series with the coil L206, and the inductance changes due to the change in the distribution constant. The change in the distribution constant in the helical antenna 103 is brought about by approach of a human body etc. That is, as a result of the change in the inductance of the helical antenna 103 among the coil L206 and the helical antenna 103 constituting a part of a resonance circuit, an oscillating frequency of the first oscillation circuit 102 changes.

It can be understood that the Colpitts oscillation circuit shown in FIG. 2A is one obtained by connecting the helical antenna 103 to a coil constituting a resonance circuit of a well known Colpitts oscillation circuit through the capacitor C210.

[Specific Examples of Second Oscillation Circuit 104, Mixer 106 and BPF 107]

Figure 3B:
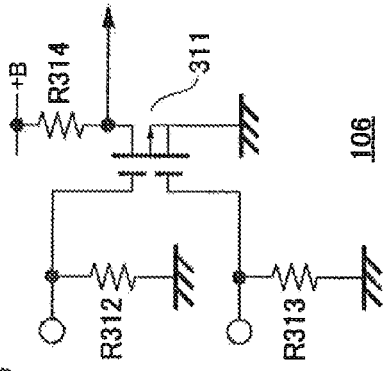
FIGS. 3A, 3B and 3C show a circuit diagram of a second oscillation circuit, a circuit diagram of a mixer, and a circuit diagram of a BPF, respectively.
Figure 3A:
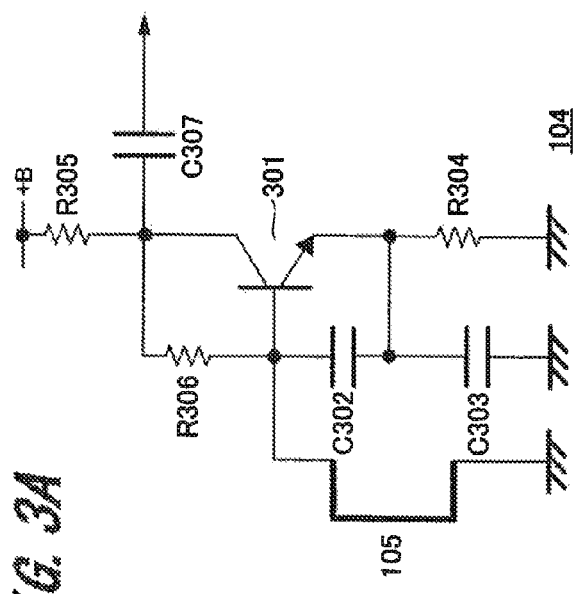
Figure 3C:
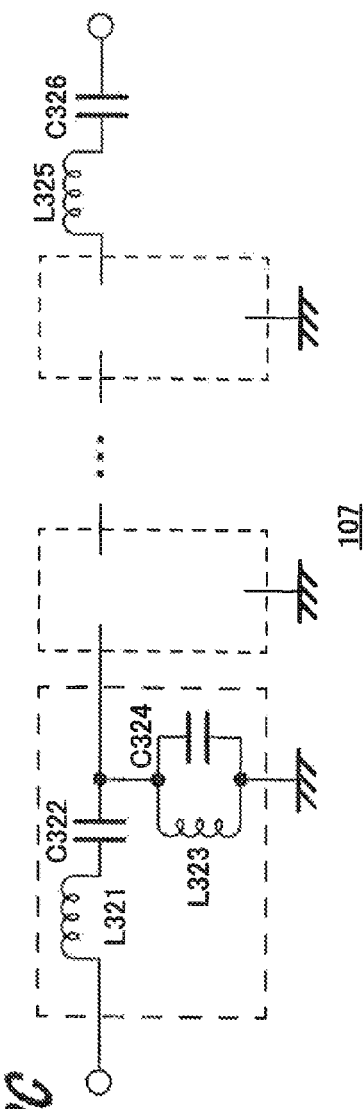

FIG. 3A is a circuit diagram of the second oscillation circuit 104. FIG. 3B is a circuit diagram of the mixer 106. FIG. 3C is a circuit diagram of the BPF 107.

First, the configuration of the second oscillation circuit 104 will be explained with reference to FIG. 3A.

The second oscillation circuit 104 is a well known Colpitts oscillation circuit. Unlike the Colpitts oscillation circuit in FIG. 2A, there is provided a resonance circuit that includes capacitors C302 and C303 and the loop antenna 105, that is, a coil between the base and emitter of a transistor 301.

The loop antenna 105 is connected between the base of the transistor 301 and the ground node. Further, the capacitors C302 and C303 are connected in series, in parallel to the loop antenna 105. The connection point between the capacitors C302 and C303 is connected to the emitter of the transistor 301. A resistance R304 is connected between the emitter of the transistor 301 and the ground node.

A resistance R305 is connected between the collector of the transistor 301 and the power supply terminal +B. Further, a resistance R306 is connected between the collector and base of the transistor 301, and, accordingly, the resistance R306 configures a well known self bias circuit.

An output signal of the second oscillation circuit 104 is obtained from the collector of the transistor 301 through a capacitor C307.

In FIG. 3A, the inductance of the loop antenna 105 changes due to the change in the distribution constant. The change in the distribution constant in the loop antenna 105 is caused by approach of a human body etc. That is, as a result of the change in the inductance of the loop antenna 105 that constitutes a part of the resonance circuit, the oscillating frequency of the second oscillation circuit 104 changes.

Meanwhile, for the first oscillation circuit 102 and the second oscillation circuit 104, a Colpitts oscillation circuit is used, but the oscillation circuit is not limited to this. An oscillation circuit that uses an LC resonance circuit such as a well-known Hartley oscillation circuit is sufficient.

Next, the configuration of the mixer 106 will be explained with reference to FIG. 3B.

Various embodiments are considered for the mixer 106, but one that can easily be actualized in high frequency waves is a dual gate FET 311 shown in FIG. 3B.

An output signal of the first oscillation circuit 102 is applied to a first gate of the dual gate FET 311, in which a resistance R312 is connected between the first gate and the ground node.

An output signal of the second oscillation circuit 104 is applied to a second gate of the dual gate FET 311, in which a resistance R313 is connected between the second gate and the ground node.

As a result, a multiplication output signal is obtained from the drain of the dual gate FET 311, which is connected to the power supply terminal +B through a resistance R314.

Next, the configuration of the BPF 107 will be explained with reference to FIG. 3C.

In the typical BPF 107, a series resonance circuit of a coil L321 and a capacitor C322 that forms a first stage is provided on a signal line, and a parallel resonance circuit of a coil L323 and a capacitor C324 that forms a second stage is provided between the other end of the capacitor C322 and the ground node. After this, a combination of the circuit element is connected in series as necessary, and the final stage is finished with a series resonance circuit (a coil L325 and a capacitor C326).

[Operation of Proximity Sensor 101]

Figure 4A:
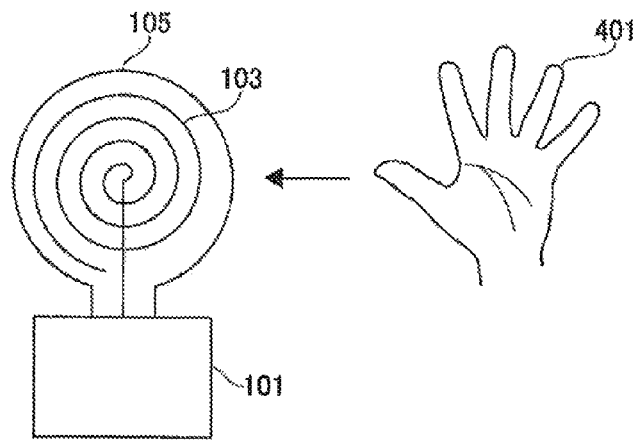
FIGS. 4A, 4B and 4C show a rough appearance view of the proximity sensor, frequency characteristics of a helical antenna and a loop antenna before a human body approaches, and frequency characteristics of the helical antenna and the loop antenna when a human body approaches, respectively.

FIG. 4A is a rough appearance view of the proximity sensor 101.

Figure 4B:
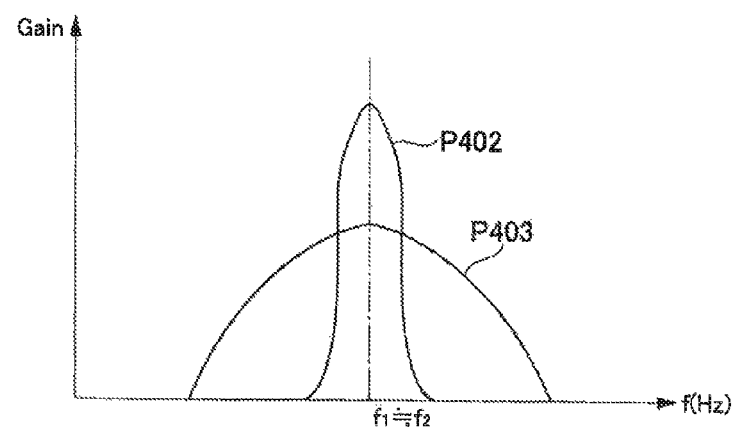

FIG. 4B shows frequency characteristics of the helical antenna 103 and the loop antenna 105 before a human body approaches.

Figure 4C:
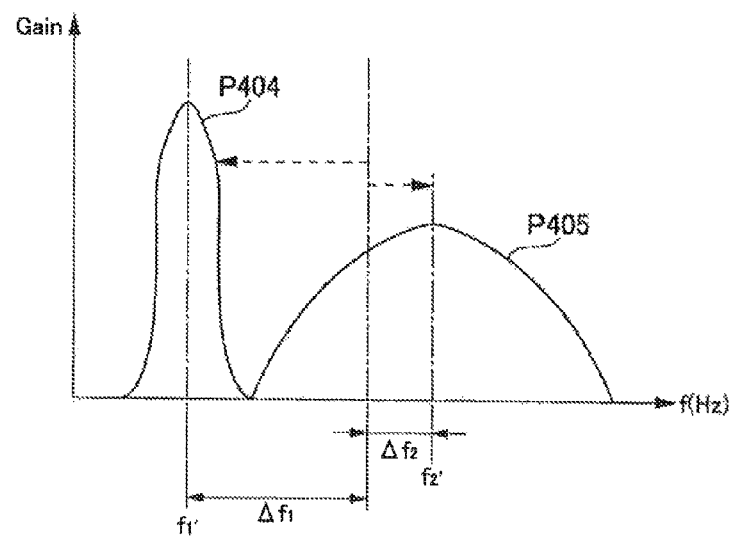

FIG. 4C shows frequency characteristics of the helical antenna 103 and the loop antenna 105 when a human body approaches.

Figure 5:
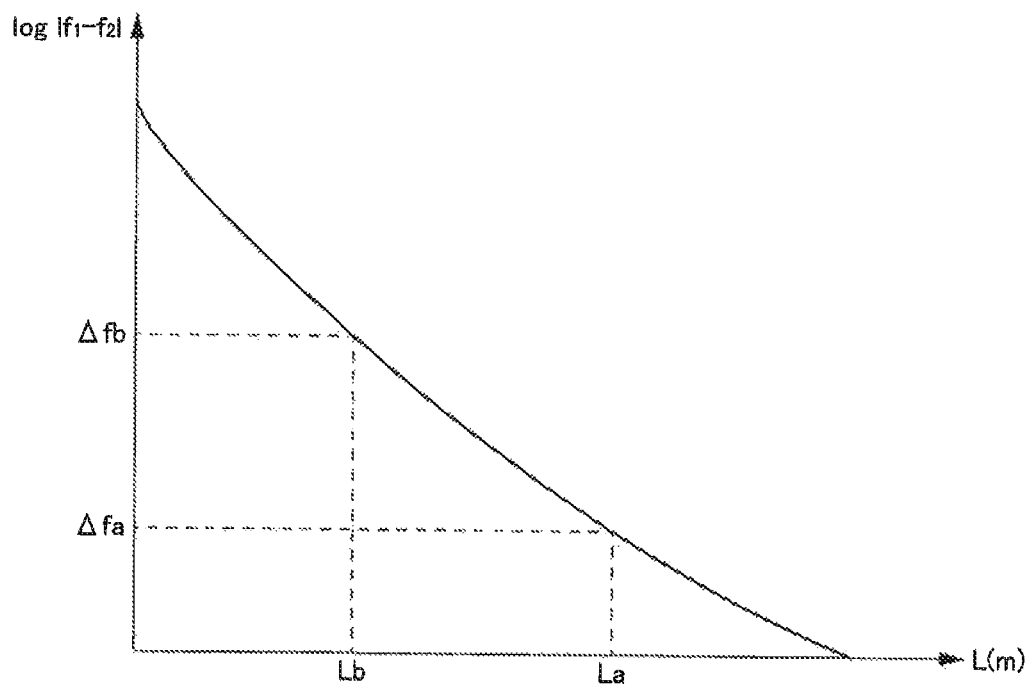
FIG. 5 is a graph showing the relationship between a distance between the proximity sensor and a human body, and the frequency of a signal obtained from the mixer.

FIG. 5 is a graph showing the relationship between the distance between the proximity sensor 101 and a human body, and a frequency of a signal obtained from the mixer 106.

First, the configuration of the proximity sensor 101 will be explained with reference to FIG. 4A.

It is known that the circuit configuration of the proximity sensor 101 is simple, from explanations of FIG. 1 to FIG. 3C. The proximity sensor 101 can easily be mounted even by hand on a substrate of around 5 cm square. If chip parts are used, the proximity sensor 101 may be mounted even on a substrate of 2.5 cm square. Further, dimensions of the helical antenna 103 and the loop antenna 105 can be made small by appropriately selecting oscillating frequencies that are adopted by the first oscillation circuit 102 and the second oscillation circuit 104.

For detecting accurately a proximity state of a human body, these two antennas desirably lie in places not largely apart from a circuit substrate. In the proximity sensor 101 shown in FIG. 4A, the helical antenna 103 is provided on the inner circumference of the loop antenna 105. Further, for example, by mounting these antennas together with the circuit of the proximity sensor 101 on a flexible substrate, size reduction can be achieved and yield in mass-production can also be improved.

When a human body 401 approaches gradually the proximity sensor 101 configured as shown in FIG. 4A from far away, frequency characteristics of the helical antenna 103 and the loop antenna 105 change.

FIG. 4B shows a frequency characteristic P402 of the helical antenna 103 and a frequency characteristic P403 of the loop antenna 105, before the human body 401 approaches. Meanwhile, for simplifying explanations, it is assumed that central frequencies of the helical antenna 103 and the loop antenna 105 coincide with frequencies of the first oscillation circuit 102 and the second oscillation circuit 104.

In the proximity sensor 101 according to the embodiment of the present invention, the first oscillation circuit 102 and the second oscillation circuit 104 are designed so as to resonate at the same frequency. Consequently, in FIG. 4B, the helical antenna 103 and the loop antenna 105 show the same central frequency. In FIG. 4B, the helical antenna 103 has a strong gain in a narrow frequency range, as shown by the curve P402. On the other hand, the loop antenna 105 has a low gain in a broad frequency range, as shown by the curve P403.

Next, FIG. 4C shows frequency characteristics of the helical antenna 103 and the loop antenna 105 after the human body 401 has approached.

In FIG. 4C, in the helical antenna 103, the resonance frequency lowers when the human body 401 approaches, as shown by a curve P404. Consequently, the oscillating frequency of the first oscillation circuit 102 changes from f1 to f1'. A frequency shift width $\Delta f1$ (=f1−f1') at this time is comparatively large.

In contrast, in the loop antenna 105, the resonance frequency rises when the human body 401 approaches, as shown by a curve P405. Consequently, the oscillating frequency of the second oscillation circuit 104 changes from f2 to f2'. A frequency shift width $\Delta f2$ (=f2'−f2) at this time is small as compared with $\Delta f1$.

Mankind is a dielectric substance containing much water. When the dielectric substance approaches a loop antenna, the inductance of the loop antenna lowers. When the inductance lowers, the resonance frequency of the loop antenna rises. The change in the resonance frequency relative to the distance between a loop antenna and a dielectric substance is also described in "MOBILE TERMINAL APPARATUS AND METHOD FOR ADJUSTING RFID ANTENNA RESONANCE FREQUENCY THEREOF," WO 2013/89195.

On the other hand, when a dielectric substance approaches an antenna having an open end such as a helical antenna, capacitance of a space surrounding the antenna rises. When the capacitance rises, the resonance frequency of the antenna having an open end becomes low. The change in the resonance frequency relative to the distance between an antenna having an open end and a dielectric substance is also described in "ANTENNA DEVICE," WO 2010/47032.

From the above, a graphed relationship between the distance between the proximity sensor 101 and the human body 401, and the frequency of the frequency difference signal obtained from the mixer 106 is shown in FIG. 5.

When the frequency f1 being the oscillating frequency of the first oscillation circuit 102 and the frequency f2 being the oscillating frequency of the second oscillation circuit 104 are set to be the same frequency, among signals obtained from the mixer 106, the frequency difference signal |f1−f2| (=f2−f1) becomes zero theoretically. Further, when the human body 401 approaches the proximity sensor 101, the frequency f1 of the first oscillation circuit 102 becomes low with a large frequency fluctuation, and the frequency f2 of the second oscillation circuit 104 becomes high with a small frequency fluctuation. That is, the frequency difference signal f2−f1 appears as a signal of prescribed frequency. In the end, when the distance between the helical antenna 103 and the loop antenna 105 of the proximity sensor 101 and the human body 401 becomes zero, the frequency difference signal f2−f1 results in a prescribed frequency. Therefore, the graph shown in FIG. 5 is represented by a curve that is close to a linear function.

Meanwhile, the ordinate axis in FIG. 5 is represented by a common logarithm of frequency.

When the central frequency and bandwidth of the BPF 107, that is, a pass band is set appropriately, the proximity sensor 101 can obtain an appropriate detection output signal corresponding to the distance of the human body 401 relative to the proximity sensor 101.

By setting the pass band of the BPF 107 so as to include Δfa, which is the frequency at which the frequency difference signal f2−f1 appears distinctly when the human body 401 approaches a place of a prescribed distance relative to the proximity sensor 101, and Δfb, which is the frequency of the frequency difference signal f2−f1 in a case where the human body 401 sufficiently approaches the proximity sensor 101, the BPF 107 outputs an output signal of a significant gain when the frequency difference signal f2−f1 lies in the range of Δfa to Δfb. By subjecting the output signal of the BPF 107 to AM detection with the AM detection circuit 108 and removing a noise component with an LPF, a signal utilizable as a logic signal showing a state where the human body 401 has approached is obtained. Accordingly, the proximity sensor 101 can detect appropriately a state where the human body 401 has approached a place of a prescribed distance and output the first output signal.

Further, the pass band of the BPF 107 has correlation with the distance of the human body 401 relative to the proximity sensor 101. Accordingly, the detection distance of the human body 401 relative to the proximity sensor 101 can be set freely according to setting of the pass band of the BPF 107.

As an example, a prototype of the proximity sensor 101 was fabricated, in which the oscillating frequency f1 of the first oscillation circuit 102 and the oscillating frequency f2 of the second oscillation circuit 104 were set to be 120 MHz. As a result, when the human body 401 approached the helical antenna 103 and the loop antenna 105 of the prototype up to around 1 m, the oscillating frequency f1' of the first oscillation circuit 102 decreased to around 119 MHz, and the oscillating frequency f2' of the second oscillation circuit 104 increased to around 120.2 MHz. Consequently, the frequency difference signal f2'−f1' appeared as a signal of a frequency of approximately 1 MHz, and the prototype was able to detect significantly presence of the human body 401.

Meanwhile, if a fluctuation width of the frequency difference signal f2−f1 is large between cases where the human body 401 is close or not close to the antenna, f1 and f2 are not necessarily the same. Generally, a higher frequency brings about a larger fluctuation width of the resonance frequency of an antenna. Accordingly, if the frequency fluctuation of the frequency difference signal f2−f1 can be detected significantly, an allowance can be given to a margin of oscillating frequencies of the first oscillation circuit 102 and the second oscillation circuit 104.

Preferably, when the human body 401 is not close to the antenna, the frequency of frequency difference signal f2−f1 preferably does not exceed the detection limit of the BPF 107. For example, when a low-frequency side cutoff frequency of the BPF 107 is 1 MHz, desirably the frequency of the frequency difference signal f2−f1 is 100 kHz or less, preferably less than 50 kHz.

[Operation of FM Detection Circuit 111]

Hereinbefore, it is explained that the proximity sensor 101 according to the embodiment of the present invention can give the first output signal, which corresponds to the distance between the helical antenna 103 and the loop antenna 105, and the human body 401, from the first output terminal 110 through the BPF 107 and the AM detection circuit 108.

On the other hand, the FM detection circuit 111 outputs a signal corresponding to the change in the frequency and phase of the frequency difference signal f2−f1. That is, the FM detection circuit 111 outputs a signal corresponding to a moving speed of the human body 401, instead of the distance between the helical antenna 103 and the loop antenna 105, and the human body 401. The signal is input, after a noise component is removed by the second LPF 112, to the microcomputer 113 having a built-in A/D converter along with the first output signal. Then, when the first output signal shows logical "true," a voltage of the signal obtained from the second LPF 112 is compared with a prescribed threshold value. As a result, a second output signal, which shows a determination result corresponding to the moving speed of a hand when the hand of a mankind lies in a range of a prescribed distance relative to the helical antenna 103 and the loop antenna 105, can be obtained from the second output terminal 114.

For example, it becomes possible to give a variation to the operation of application of the proximity sensor 101, such that a comparatively dark room light is lighted when a hand approaches slowly, and that a bright room light is lighted when the hand approaches quickly. Further, since movements of the human body 401 can be detected from the output signal of the FM detection circuit 111, the utilization as a sensor of a sleep meter that measures movements of the human body 401 in sleep is possible, by binarizing the output signal of the FM detection circuit 111 by an LPF and a comparator.

Further, when the FM detection circuit 111 outputs a significant output signal, it means that the human body 401 being a detection target approaches. Accordingly, by dealing with the output signal of the FM detection circuit 111 as a digital logic signal, instead of dealing with it as an analog voltage, and by outputting the logical product of the first output signal of the AM detection circuit 108 and the output signal of the FM detection circuit 111 as a second output signal, it can be expected to reduce the influence of noise mixed in the first output signal of the AM detection circuit 108, which is caused by reflection of an electric wave, exogenous noise or the like. In this case, the microcomputer 113 functions as a logic signal output unit (AND gate) that outputs logical product of the first output signal of the AM detection circuit 108 and the output signal of the FM detection circuit 111.

For the embodiment having been explained, application examples described below are possible.

(1) In the above-described embodiment, only one BPF 107 is provided, but it is also considered to provide two or more BPFs 107.

For example, for a first BPF, the bandwidth and attenuation quantity at the blocking frequency of the BPF are appropriately designed so that the frequency difference signal f2−f1 is output when the distance of the human body 401 relative to the helical antenna 103 and the loop antenna 105 lies in a range of 1 m to 50 cm.

Further, for a second BPF, the bandwidth and attenuation quantity at the blocking frequency of the BPF are appropriately designed so that the frequency difference signal f2−f1 is output when the distance of the human body 401 relative to the helical antenna 103 and the loop antenna 105 lies in a range of 30 cm or less.

A first AM detection circuit 108 is connected to the trailing end of the first BPF, and a second AM detection circuit 108 is connected to the trailing end of the second BPF. As a result, different output signals are obtained from the first AM detection circuit 108 and the second AM detection circuit 108, corresponding to the distance of the human body 401 relative to the helical antenna 103 and the loop antenna 105.

Furthermore, by starting up a timer based on a signal obtained from the first AM detection circuit 108 and by measuring time difference relative to a signal obtained from the second AM detection circuit 108, a determination result corresponding to the moving speed of a hand, which is similar to the case of the above-described FM detection circuit 111, can also be obtained.

(2) By providing an LPF that removes an f1+f2 signal from the output of the mixer 106 instead of the use of the BPF 107 and, subsequently, using a well known FFT (fast Fourier transformation), presence or absence of a specific frequency component corresponding to the distance of the human body 401 relative to the helical antenna 103 and the loop antenna 105 may be detected.

(3) In the proximity sensor 101 of the above-described embodiment, a mechanism is used, in which both the first oscillation circuit 102 and the second oscillation circuit 104 are caused to oscillate at an approximately same frequency and the frequency difference signal f2−f1 that appears due to the change in respective oscillating frequencies when the human body 401 approaches the helical antenna 103 and the loop antenna 105 is detected.

In contrast, such a configuration is also possible that, inversely, the first oscillation circuit 102 and the second oscillation circuit 104 are previously caused to oscillate at different frequencies and, when the human body 401 approaches the helical antenna 103 and the loop antenna 105, respective oscillating frequencies change to thereby approximate the difference of frequencies to zero. Specifically, the oscillating frequency of the second oscillation circuit 104 is set to be lower than the oscillating frequency of the first oscillation circuit 102. When a human body approaches, the difference between the respective oscillating frequencies becomes small. So that the frequency difference signal f2−f1 does not appear when the human body 401 approaches the helical antenna 103 and the loop antenna 105, a high-pass filter (HPF) is provided in place of the first LPF 109 for a latter stage of the AM detection circuit 108 and in place of the second LPF 112 for a latter stage of the FM detection circuit 111.

In the above-described embodiment, the proximity sensor 101 is explained, in which both the first oscillation circuit 102 that uses the helical antenna 103, that is, an antenna having an open end as a part of an element for a resonance circuit and the second oscillation circuit 104 that uses the loop antenna 105, that is, an antenna not having an open end and having both ends connected to a circuit as a part of an element for a resonance circuit are caused to oscillate at approximately the same frequency.

In such a proximity sensor 101, when the human body 401 approaches the helical antenna 103 and the loop antenna 105, the oscillating frequency of the first oscillation circuit 102 connected to the helical antenna 103 becomes low, but the oscillating frequency of the second oscillation circuit 104 connected to the loop antenna 105 becomes high. The change in the oscillating frequency in each of the oscillation circuits is extracted with the BPF 107, after a frequency difference signal is generated in the mixer 106 (multiplication device). The frequency of the extracted frequency difference signal becomes higher as the distance of the human body 401 relative to the helical antenna 103 and the loop antenna 105 becomes smaller. The signal is extracted with the BPF 107 and, after that, is subjected to envelope detection to be used for detecting proximity. By appropriately setting the central frequency and bandwidth of the BPF 107, it is possible to obtain a signal corresponding to the distance of the human body 401 relative to the helical antenna 103 and the loop antenna 105.

The proximity sensor 101 of the embodiment deals with signals of low frequencies such as around several ten to several hundred MHz, as compared with conventional Doppler sensors. Consequently, price of circuit elements is low, because inexpensive transistors for small signals can be used, for example. Further, since it deals with signals of low frequencies, mounting of circuits is easy, including the BPF 107.

Further, the proximity sensor 101 of the embodiment has an extremely small circuit scale, as compared with conventional Doppler sensors. As is well known, one diode is sufficient for the AM detection circuit 108. When only the first output signal is to be taken out, as semiconductor elements necessary for implementing the proximity sensor 101 of the embodiment, excluding a diode, total three are sufficient such that one transistor 201 for the first oscillation circuit 102, one transistor 301 for the second oscillation circuit 104, and one dual gate FET 311 for the mixer 106. Accordingly, the sensor can be manufactured inexpensively and be mass-produced easily.

Further, the proximity sensor 101 of the embodiment does not use an electric wave for irradiating a measurement target object, unlike conventional Doppler sensors. The proximity sensor 101 of the embodiment absolutely detects the change in the distribution constant of an antenna. That is, both the first oscillation circuit 102 and the second oscillation circuit 104 do not require electric power for emitting an electric wave. Accordingly, electric power consumption is extremely small, as compared with conventional Doppler sensors. In this respect, too, the proximity sensor 101 of the embodiment can utilize inexpensive semiconductor elements.

Furthermore, since the frequency difference signal between two oscillation circuits is detected, frequency drift due to the change in a circuit constant along with the change in temperature is cancelled at the time point that the signal has passed through the mixer 106. Accordingly, temperature fluctuation is extremely small theoretically to thereby give a sensor that is resistant to temperature fluctuation, robust, and easy-to-handle and has a broad application range.

Hereinbefore, the embodiment of the present invention is explained, but the present invention is not limited to the above-described embodiment, and includes other modification examples and application examples, unless they do not deviate from the gist of the present invention described in the claims.

For example, the above-described embodiment is that in which configurations of apparatus and system are explained minutely and specifically for explaining the present invention intelligibly, and the embodiment is not necessarily limited to that provided with all configurations having been explained. Further, it is possible to substitute a part of the configuration of an embodiment by the configuration of another embodiment, and, furthermore, it is also possible to add the configuration of another embodiment to the configuration of an embodiment. It is also possible to perform addition of another configuration, elimination or substitution, for a part of the configurations of respective embodiments.

A part or the whole of above-described respective configurations, functions, processing units etc. may be actualized by hardware, for example, by designing these with an integrated circuit. Further, above-described respective configurations, functions etc. may be actualized by software for interpreting and executing a program that causes a processor to actualize respective functions. Information such as a program for actualizing respective functions, tables and files can be stored on a volatile or nonvolatile storage such as a memory, a hard disk, an SSD (Solid State Drive), or a recording medium such as an IC card and an optical disk.

Control lines and information lines show those that are considered to be necessary for explanation, and show not necessarily all control lines and information lines in products. It may be considered that actually almost all configurations are connected with each other.

REFERENCE SIGNS LIST

101: proximity sensor, 102: first oscillation circuit, 103: helical antenna, 104: second oscillation circuit, 105: loop antenna, 106: mixer, 107: BPF, 108: AM detection circuit, 109: first LPF, 110: first output terminal, 111: FM detection circuit, 112: second LPF, 113: microcomputer, 114: second output terminal, 201, 301: transistor, 311: dual gate FET, 401: human body

The invention claimed is:

1. A proximity sensor comprising:
a first oscillation circuit that uses a first antenna having an open end as a part of an element for a resonance circuit;
a second oscillation circuit that uses a second antenna having both ends connected to a circuit as a part of an element for a resonance circuit; and
a proximity detection unit that detects a proximity state of an arbitrary detection target based on the frequency difference between a first output signal output from the first oscillation circuit and a second output signal output from the second oscillation circuit, wherein
the proximity detection unit includes:
   a mixer that receives the first output signal and the second output signal to generate a frequency difference signal,
   a band pass filter that allows a signal of a specific frequency to pass through from the frequency difference signal, and
   an AM detection circuit that performs envelope detection on an output signal of the band pass filter, and wherein
in the first oscillation circuit and the second oscillation circuit, the frequency difference between the first output signal and the second output signal is not more than a low-frequency side cutoff frequency of the band pass filter in a non-proximity state of the arbitrary detection target.

2. The proximity sensor according to claim 1, wherein
a frequency of the frequency difference signal passing through the band pass filter is a frequency in a state where the arbitrary detection target approaches the first antenna and the second antenna in a prescribed distance.

3. The proximity sensor according to claim 2, further comprising:
an FM detection circuit that performs frequency and/or phase difference detection on an output signal of the band pass filter; and
a logic signal output unit that outputs a logical product of an output signal of the AM detection circuit and an output signal of the FM detection circuit.

4. The proximity sensor according to claim 1, further comprising:
an FM detection circuit that performs frequency and/or phase difference detection on an output signal of the band pass filter; and
a logic signal output unit that outputs a logical product of an output signal of the AM detection circuit and an output signal of the FM detection circuit.

5. A proximity sensor comprising:
a first oscillation circuit that uses a first antenna having an open end as a part of an element for a resonance circuit;
a second oscillation circuit that uses a second antenna having both ends connected to a circuit as a part of an element for a resonance circuit; and
a proximity detection unit that detects a proximity state of an arbitrary detection target based on the frequency difference between a first output signal output from the first oscillation circuit and a second output signal output from the second oscillation circuit, wherein
the proximity detection unit includes:
   a mixer that receives the first output signal and the second output signal to generate a frequency difference signal,
   a band pass filter that allows a signal of a specific frequency to pass through from the frequency difference signal, and
   an AM detection circuit that performs envelope detection on an output signal of the band pass filter, and wherein
in the first oscillation circuit and the second oscillation circuit, the frequency difference between the first output signal and the second output signal is not more than a low-frequency side cutoff frequency of the band pass filter in a proximity state of the arbitrary detection target.

6. The proximity sensor according to claim 5, wherein
a frequency of the frequency difference signal passing through the band pass filter is a frequency in a state where the arbitrary detection target approaches the first antenna and the second antenna in a prescribed distance.

* * * * *